United States Patent
Schmitt

(10) Patent No.: US 6,228,438 B1
(45) Date of Patent: May 8, 2001

(54) PLASMA REACTOR FOR THE TREATMENT OF LARGE SIZE SUBSTRATES

(75) Inventor: Jacques Schmitt, La Ville du Bois (FR)

(73) Assignee: Unakis Balzers Aktiengesellschaft (LI)

( * ) Notice: Subject to any disclaimer, the term of this patent is extended or adjusted under 35 U.S.C. 154(b) by 0 days.

(21) Appl. No.: 09/401,158

(22) Filed: Sep. 22, 1999

(30) Foreign Application Priority Data

Aug. 10, 1999 (CH) ................................... 1466/99

(51) Int. Cl.$^7$ ............................. C23C 4/02; C23C 16/50; B05D 3/14
(52) U.S. Cl. .................. 427/569; 427/535; 427/534; 216/71; 118/723 E
(58) Field of Search .................. 427/569, 534, 427/535, 488; 216/71; 118/723 E

(56) References Cited

U.S. PATENT DOCUMENTS

| | | | |
|---|---|---|---|
| 4,312,575 | * 1/1982 | Peyman et al. | 427/488 |
| 4,425,210 | 1/1984 | Fazlin . | |
| 5,124,173 | * 6/1992 | Uchiyama et al. . | |
| 5,143,748 | * 9/1992 | Ishikawa et al. . | |
| 5,292,394 | * 3/1994 | Cord et al. | 118/723 E |
| 5,302,420 | * 4/1994 | Nguyen et al. . | |
| 5,439,524 | * 8/1995 | Cain et al. | 118/723 E |
| 5,443,689 | * 8/1995 | Kimura et al. | 118/723 E |
| 5,560,963 | * 10/1996 | Tisack | 427/535 |
| 5,628,869 | * 5/1997 | Mallon . | |
| 5,653,812 | * 8/1997 | Petrmichl et al. | 118/723 E |
| 5,696,566 | * 12/1997 | Suzuki et al. | 118/723 E |
| 5,804,089 | * 9/1998 | Suzuki et al. | 216/71 |
| 5,895,558 | * 4/1999 | Spence | 427/569 |
| 5,990,016 | * 11/1999 | Kim et al. | 216/71 |

FOREIGN PATENT DOCUMENTS

| | | |
|---|---|---|
| 0280074 | 2/1988 | (EP) . |
| 2342783 | 2/1977 | (FR) . |
| 2261396 | 5/1993 | (GB) . |

* cited by examiner

Primary Examiner—Marianne Padgett
(74) Attorney, Agent, or Firm—Notaro & Michalos P.C.

(57) ABSTRACT

A radiofrequency plasma reactor (1) for the treatment of substantially large sized substrates is disclosed, comprising between the electrodes (3, 5) of the plasma reactor a solid or gaseous dielectric layer (11) having a non planar-shaped surface-profile, said profile being defined for compensating a process non uniformity in the reactor or generating a given distribution profile.

3 Claims, 5 Drawing Sheets

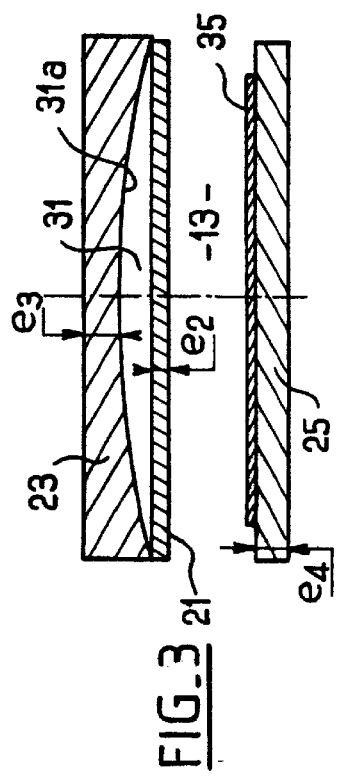
FIG_3
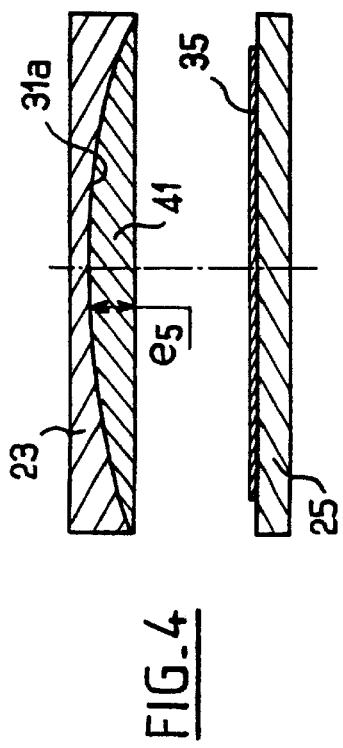
FIG_4
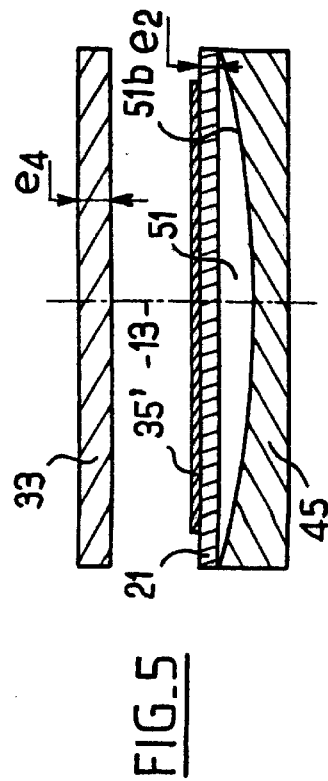
FIG_5
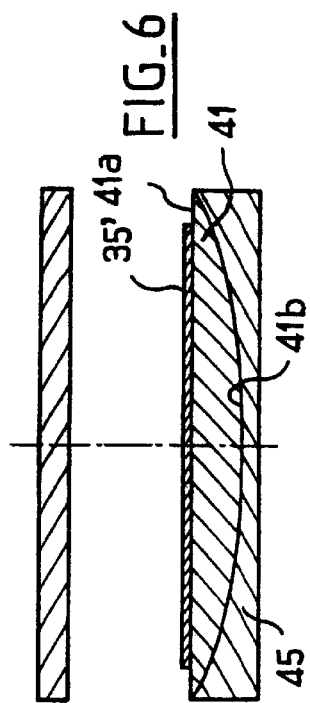
FIG_6
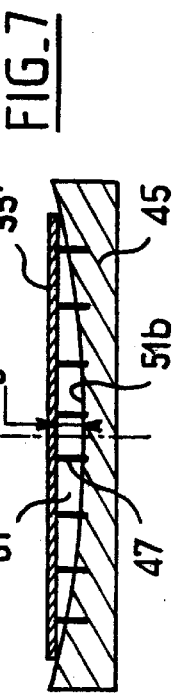
FIG_7
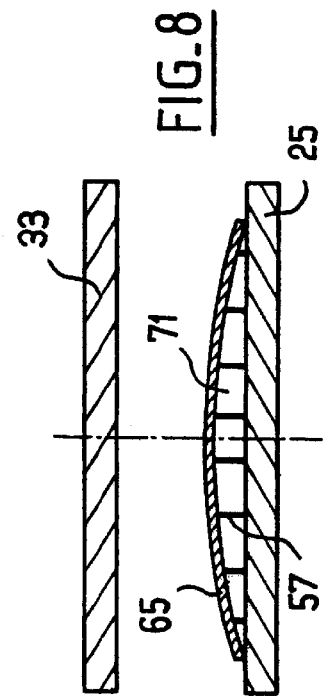
FIG_8

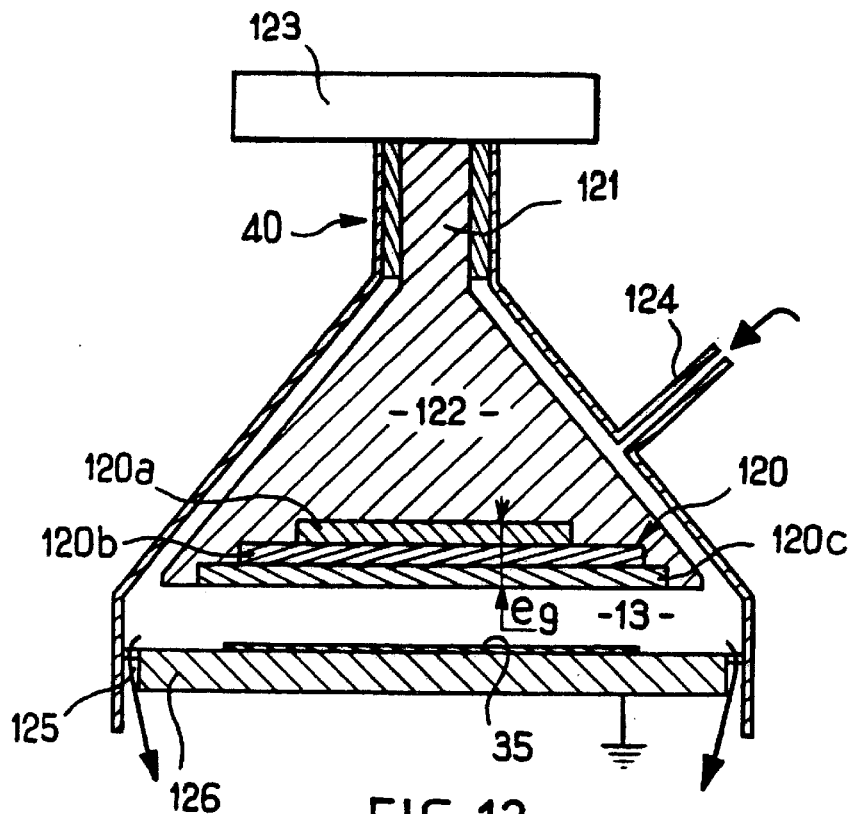
FIG_12
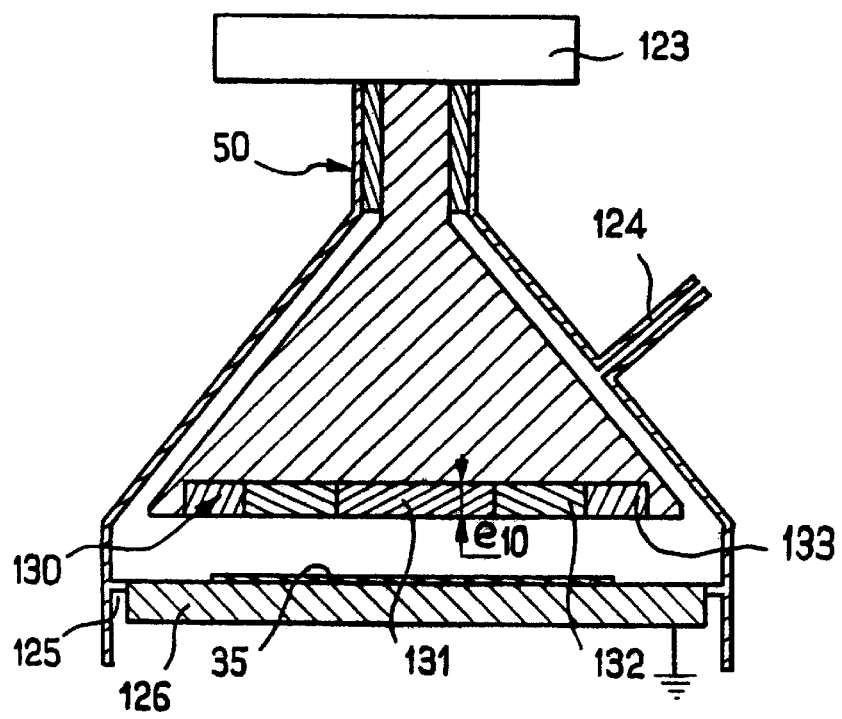
FIG_13

PLASMA REACTOR FOR THE TREATMENT OF LARGE SIZE SUBSTRATES

FIELD AND BACKGROUND OF THE INVENTION

The invention relates to a capacitively coupled radiofrequency (RF) plasma reactor and to a process for treating at least one substrate in such a reactor. Especially, the present invention applies to a large size capacitive capacitively coupled (RF) plasma reactor.

Often, such a reactor is known as a "capacitive" RF glow discharge reactor, or planar plasma capacitor or parallel plate RF plasma reactor, or as a combination of the above named. Capacitive RF plasma reactors are typically used for exposing a substrate to the processing action of a glow discharge. Various processes are used to modify the nature of the substrate surface. Depending on the process and in particular the nature of the gas injected in the glow discharge, the substrate properties can be modified (adhesion, wetting), a thin film added (chemical vapour deposition CVD, diode sputtering) or another thin film selectively removed (dry etching). The table shown below gives a simplified summary of the various processes possibly performed in a low pressure capacitive discharge.

| Industry | Substrate type | Process | Inlet gas nature |
| --- | --- | --- | --- |
| Semiconductor | wafer up to 30 cm diameter | - Surface Cleaning<br>- PECVD<br>- Dry Etching<br>- Ashing | - Ar<br>- $SiH_4$, . . .<br>- $CF_4$, $SF_6$, $Cl_2$, . . .<br>- $O_2$, |
| Disks for memory | Polymer or glass up to 30 cm diameter | - Diode sputtering<br>- PECVD<br>- Surface activation | - Ar + others<br>- Organometallics<br>- $O_2$, etc. . . . |
| Flat display | Glass up to 1.4 m diagonal | Same as for semiconductors | Same as for semiconductors |
| Window pane Web coaters | Glass up to 3 m width, foil, plastic or metal | - Cleaning/ activation, Nitriding, polymer PECVD | - Air, Argon Monomer, Nitrogen, . . . |

The standard frequency of the radiofrequency generators mostly used in the industry is 13.56 MHz. Such a frequency is allowed for industrial use by international telecommunication regulations. However, lower and higher frequencies were discussed from the pioneering days of plasma capacitor applications. Nowadays, for example for PECVD applications, (plasma enhanced chemical vapour deposition) there is a trend to shift the RF frequency to values higher than 13.56 MHz, the favourite values being 27.12 MHz and 40.68 MHz (harmonics of 13.56 MHz). So, this invention applies to RF frequencies (1 to 100 MHz range), but it is mostly relevant to the case of higher frequencies (above 10 MHz). The invention can even be applied up to the microwave range (several GHz).

An important problem was noted especially if the RF frequency is higher than 13.56 MHz and a large size (surface) substrate is used, in such a way that the reactor size is no more negligible relative to the free space wave length of the RF electromagnetic wave. Then, the plasma intensity along the reactor can no longer be uniform. Physically, the origin of such a limitation should lie in the fact that the RF wave is distributed according to the beginning of a "standing wave" spacial oscillation within the reactor. Other non uniformities can also occur in a reactor, for example non uniformities induced by the reactive gas provided for the plasma process.

It is an object of the invention to propose a solution for eliminating, or at least notably reducing, an electromagnetic (or a process) non uniformity, in a reactor. Thus, according to an important feature of the invention, an improved capacitively coupled RF plasma reactor should comprise:
  at least two electrically conductive electrodes spaced from each other, each electrode having an external surface,
  an internal process space enclosed between the electrodes,
  gas providing means for providing the internal process space with a reactive gas,
  at least one radiofrequency generator connected to at least one of the electrodes, at a connection location, for generating a plasma discharge in the process space, and potentially an additional RF generator for increasing the ion bombardment on the substrate,
  means for evacuating the reactive gas from the reactor, so that said gas circulates within the reactor, at least in the process space thereof,
  at least one substrate defining one limit of the internal process space, to be exposed to the processing action of the plasma discharge, said at least one substrate extending along a general surface and being arranged between the electrodes,
  characterized in that it further comprises at least one dielectric "corrective" layer extending outside the internal process space, as a capacitor electrically in series with said at least one substrate and the plasma, said at least one dielectric layer having capacitance per unit surface values which is not uniform along at least one direction of said general surface, for compensating a process non uniformity in the reactor or to generate a given distribution profile.

In other words, the proposed treating process in the reactor of the invention comprises the steps of:
  locating the at least one substrate between at least two electrodes, the substrate extending along a general surface,
  having a reactive gas (or gas mixture) in an internal process space arranged between the electrodes,
  having a radiofrequency generator connected to at least one of the electrodes, at a connection location,
  having a plasma discharge in at least a zone of the internal process space facing the substrate, in such a way that said substrate is exposed to the processing action of the plasma discharge,
  creating an extra-capacitor electrically in series with the substrate and the plasma, said extra-capacitor having a profile, and
  defining the profile of the extra-capacitor in such a way that it has location dependent capacitance per unit surface values along at least one direction of the general surface of the substrate.

It is to be noted that such a solution is general. It is valid for all plasma processes, but only for a determined RF frequency.

The "tailored extra-capacitor" corresponding to the above-mentioned said (substantially) "dielectric layer" acts as a component of a capacitive divider. Advantageously, the capacitive variations will be obtained through a non uniform thickness of the layer. Thus, the extra-capacitor will have a profile having a non planar-shape along a surface.

For compensating a non uniform voltage distribution across the process space of the reactor, said thickness will preferably be defined in such a way that:

the so-called "corrective layer" is the thickest in front of the location in the process space (where the plasma is generated) which is the farest away from the connection location where the radiofrequency generator is connected to said at least one electrode, the distance being measured by following the electrode external surface, and said thickness preferably decreases from said process space location, as the distance between the process space location and the connection location on the corresponding electrode decreases.

Of course, it is to be understood that the above-mentioned "distance" is the shortest of all possible ways.

So, if the electromagnetic travelling waves induced in the process space combine each other near the center of the reactor to form a standing wave having a maximum of voltage in the vicinity of the reactor center, the thickness of the so-called "corrective layer" will be larger in the vicinity of the center thereof, than at its periphery.

One solution in the invention for tailoring said "corrective layer" is to shape at least one surface of the layer in such a way that the layer has a non planar-shaped external surface, preferably a curved concave surface facing the internal process space where the plasma is generated. Various ways can be followed for obtaining such a "non planar shaped" surface on the layer.

It is a priviledged way in the invention to shape at least one of the electrodes, in such a way that said electrode has a non planar-shaped surface facing the substrate, and especially a generally curved concave surface. It is another object of the invention to define the composition or constitution of the so-called "corrective layer".

According to a preferred solution, said layer comprises at least one of a solid dielectric layer and gaseous dielectric layer. If the layer comprises such a gaseous dielectric layer, it will preferably be in gaseous communication with the internal process space where the plasma is generated. A substrate comprising a plate having a non planar-shaped external surface is also a solution for providing the reactor of the invention with the so-called "corrective layer".

Another object of the invention is to define the arrangement of the substrate within the reactor. Therefore, the substrate could comprise (or consist in) a solid member arranged against spacing members located between said solid member and one of the electrodes, the spacing member extending in said "corrective layer" along a main direction and having, each, an elongation along said main direction, the elongations being non uniform along the solid member. A difficulty induced by such spacing members relates to a local perturbation relative to the contact between the solid member and the substrate. So, the invention suggests that the spacing members preferably comprise a solid end adapted to be arranged against the solid member, said solid end having a space therearound. Below, the description only refers to a capacitively coupled RF plasma reactor in which the improvements of the invention notably reduce the electromagnetic non uniformity during the plasma process.

First of all, for most processing plasmas, the electromagnetic propagation brings really a limitation in RF plasma processing for substrate sizes of the order, or larger than 0.5 $m^2$ and especially larger than 1 $m^2$, while the frequency of the RF source is higher than 10 MHz. More specifically, what is to be considered is the largest dimension of the substrate exposed to the plasma. If the substrate has a substantially square surface, said "largest dimension" is the diagonal of the square. So, any "largest dimension" higher than substantially 0.7 m is critical.

A basic problem, which is solved according to the present invention, is that, due to the propagative aspect of the electromagnetic wave created in the plasma capacitor, the RF voltage across the process space is not uniform. If a RF source is centrally connected to an electrode, the RF voltage decreases slightly from the center to the edges of said electrode.

As above-mentioned, one way to recover a (substantially) uniform RF voltage across the plasma itself, is the following:

a capacitor is introduced between the electrodes, said capacitor being in series with the plasma (and the substrate) in the reactor, this extra-capacitor acts with the plasma capacitor itself as a voltage divider tailoring the local RF power distribution, to (substantially) compensate a non uniformity of the process due, for example, to gas compositional non uniformity, to edge effects or to temperature gradient.

BRIEF DESCRIPTION OF THE DRAWINGS

Below is a more detailed description of various preferred embodiments according to the invention, in reference to drawings in which:

FIGS. 3, 4, 5, 6, 7 and 8 show alternative embodiments of the internal configuration of such a reactor.

FIGS. 9, 10, 11, 12 and 13 show further schematic embodiments of typical processes corresponding to the invention.

DESCRIPTION OF THE PREFERRED INVENTION

Figure 1:
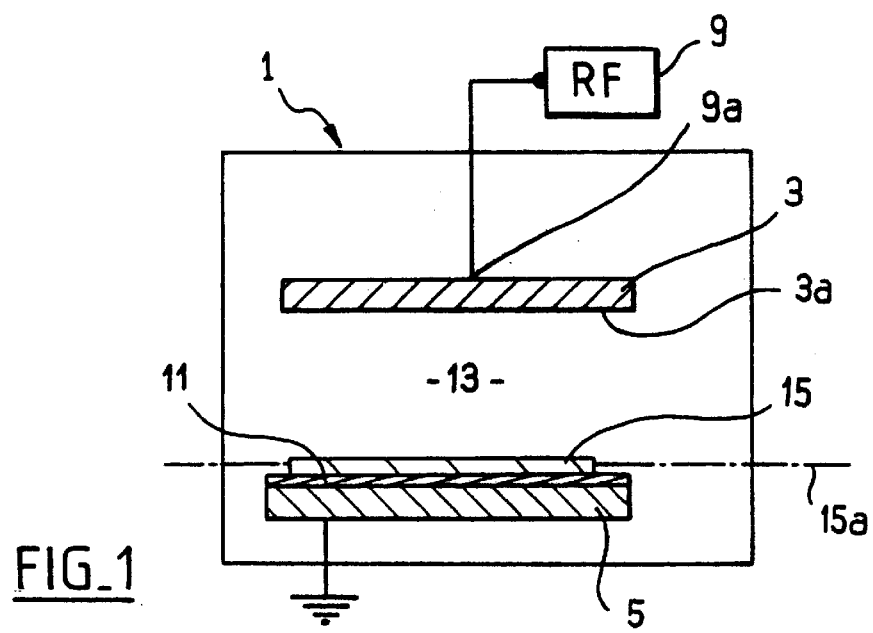
FIGS. 1 and 2 are two schematic illustrations of an improved reactor according to the invention (FIG. 1 is a section of FIG. 2 along lines I—I)
Figure 2:
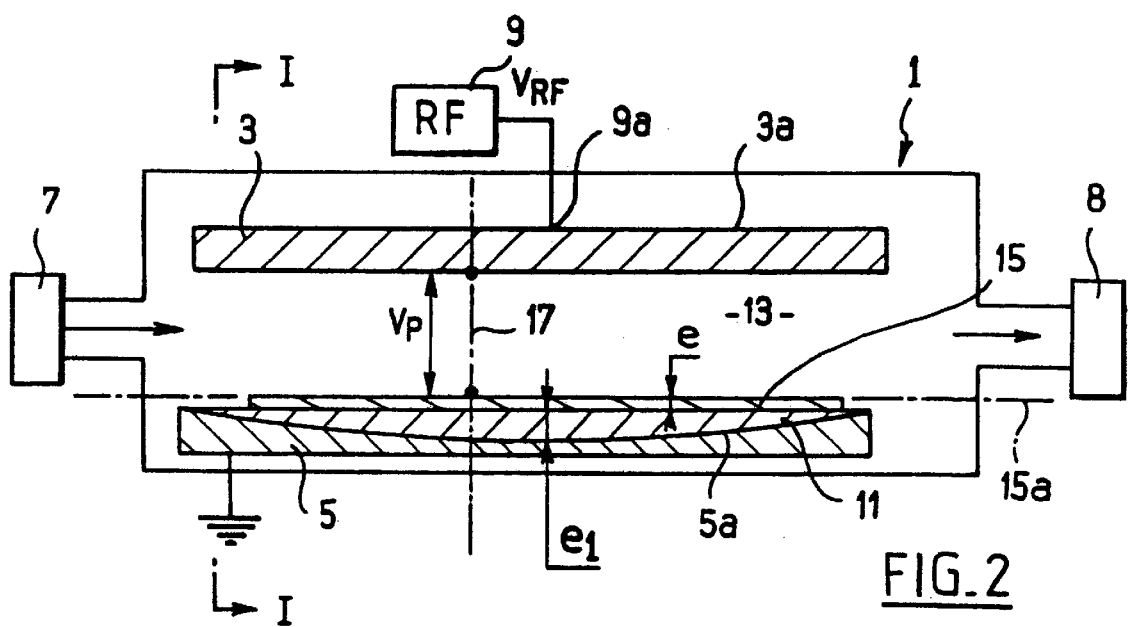

In FIGS. 1 and 2, the reactor is referenced 1. Reactor 1 encloses two metallic electrodes 3, 5 which have an outer surface, 3a, 5a, respectively. The electrodes are spaced from each other. A gas source 7 provides the reactor with a reactive gas (or a gas mixture) in which the plasma is generated through a radiofrequency discharge (see the above table). Pumping means 8 are further pumping the gas, at another end of the reactor. The radiofrequency discharge is generated by a radiofrequency source 9 connected at a location 9a to the upper electrode 3. The location 9a is centrally arranged on the back of the external surface 3a of the electrode. These schematic illustrations further show an extra-capacitor or capacitor means 11 electrically in series with the plasma 13 and a substrate 15 located thereon. The plasma 13 can be observed in the internal space (having the same numeral reference) which extends between the electrode 3 and the substrate 15. The substrate 15 can be a dielectric plate of a uniform thickness e which defines the lower limit of the internal process space 13, so that the substrate 15 is exposed to the processing action of the plasma discharge. The substrate 15 extends along a general surface 15a and its thickness e is perpendicular to said surface. The extra-capacitor 11 interposed between the substrate 15 and the lower electrode 5 induces a voltage modification in such a way that the RF voltage ($V_P$) across the plasma (for example along line 17, between the electrode 3 and the substrate 15), is only a fraction of the radiofrequency voltage ($V_{RF}$) between the electrodes 3, 5. It is to be noted that the extra-capacitor 11 is materially defined as a dielectric layer (for example a ceramic plate) having a non uniform thickness $e_1$ along a direction perpendicular to the above-mentioned surface 15a. Since the location of the RF source on the electrode 3 is central, and because of the arrangement (as illustrated in FIGS. 1 and 2) of the above-mentioned elements disposed in the reactor, the thickness $e_1$ of the dielectric plate 11 is maximal at the center thereof and progressively decreases from said center to its periphery, in such a way to compensate the electromagnetic non uniformity in the process space 13. So, the presence of said relatively thick series capacitor 11 reduces the effective voltage across the plasma. Hence, for the compensation of electromagnetic effects in a large surface reactor as illustrated in FIGS. 1 and 2, the series capacitor 11 has to be a bit thicker in the center of the reactor and must be thinned down toward the periphery thereof.

The schematic illustrations of FIGS. 3 to 8 show various possible configurations allowing such a compensation of non uniformity in a capacitively coupled radiofrequency plasma reactor, of the type illustrated in the above FIGS. 1 and 2. It will be noted that combinations of the basic options illustrated in FIGS. 3 to 8 are possible. In FIG. 3, a flat, planar ceramic plate 21 of a uniform thickness $e_2$ is attached to the upper electrode 23. There is a tailored spacing 31 between the metal electrode 23 and the ceramic plate 21. Above the other electrode 25 is arranged a substrate 35 which can be either dielectric or metallic (or electrically conductive on at least one of its surface). In FIGS. 3 to 8, the location of the connection between the power source (such as the RF source 9 of FIGS. 1 and 2) and the corresponding metallic electrode is supposed to be centrally arranged on said electrode, and the general geometry of the reactor is also supposed to be as illustrated, so that, in such conditions, the tailored layer 31 has a back surface 31a which is curved with a concave regular profile facing the process space 13.

Thus, the corresponding upper electrode 23 (the internal limit of which, facing the process space 13, is defined by surface 31a) has a variable thickness $e_3$. The dimension $e_3$ is the thinnest at the center of the electrode and the thickest at its periphery.

The second opposed electrode 25 is generally parallel to the first electrode 23 and has a uniform thickness $e_4$. It will be noted that the connection between the solid dielectric plate 21 and the tailored gap 31 is not a gas-tight connection. So, the reactive gas introduced within the process space 13 can circulate in the gap 31 which will preferably have a thickness adapted for avoiding a plasma discharge therein. Providing the "corrective gap" 31 with complementary means for avoiding said plasma discharge therein is also possible.

In FIG. 4, the electrode 23 has the same internal profile 31a as in FIG. 3. But, the "corrective layer" is presently a ceramic plate 41 having a variable thickness $e_5$.

In FIGS. 5 to 8, the substrates 35' are dielectric substrates. In FIG. 5, the above electrode 33 is a planar metallic electrode having a uniform thickness $e_4$. The lower electrode 45 corresponds to the upper electrode 23 of FIG. 3. The electrode 45 has an internal upper surface 51b which defines a rear limit for the curved concave gaseous "corrective layer". Above said layer 51 is arranged a dielectric planar horizontal plate 21. The ceramic plate 21 of a uniform thickness $e_2$ is connected at its periphery to the lower electrode 45 (counterelectrode). The substrate 35' is arranged on the ceramic plate 21.

Since the pressure of the reactive gas adapted to be introduced within the reactive space is typically between $10^{-1}$ Pa to $10^3$ Pa, the pressure within the gaseous corrective gap can be substantially equal to said injected gas pressure. Typically, the reactive gas pressure within the plasma discharge zone 13 will be comprised between 1 Pa and 30 Pa for an etching process, and will be comprised between 30 Pa and $10^3$ Pa for a PECVD process. Accordingly, the pressure within the corrective gap (31, 51 . . . ) will typically be a low pressure. So, such a gaseous dielectric gap could be called as a "partial vacuum gap".

In FIG. 6, the substrate 35' (of a uniform thickness) is laying on a solid dielectric plate (surface 41a) which can correspond to the ceramic plate 41 of FIG. 4 in an inverted position. The front, inner surface 41a of the plate 41 is flat, while its back surface 41b is convex and directly in contact with the lower metallic electrode 45, the inner surface of which is presently concave. So, the plate 41 is a sort of "lens".

The electrodes 33, 45 illustrated in FIG. 7 correspond to the electrodes of FIG. 5. The substrate 35', which has a uniform thickness, is planar and parallel to the upper metallic electrode 33. Substrate 35' is laying on small posts 47 which are erected between the electrode 45 and the substrate. The non planar internal upper surface 51b of the electrode 45 gives a non uniform thickness $e_6$ to the gaseous gap 61 between the electrode 45 and the substrate 35'. Thus, the space 61 acts as a corrective dielectric layer for compensating the process non uniformity and enables the substrate 35' to be uniformly treated by the plasma discharge.

In FIG. 8, the two opposed electrodes 25, 33 have a uniform thickness, are planar and are parallel from each other. The tailored layer 71 is obtained from a non planar substrate 65 arranged on erected posts 57. The elevations of such "spacing elements" 57 are calculated for giving the substrate 65 the required non planar profile. The design of FIG. 8 should be mechanically the most attractive, because both electrodes 33, 25 remain flat and the profile of the small gap 71 is defined by the inserts 57.

For any purpose it may serve, it will be noted that the radiofrequency power can be fed either on the electrode on which the substrate is attached, or on the opposite electrode.

In the examples of arrangements illustrated in FIGS. 1 to 8, it will further be noted that the tailored layer (11, 31, 41, 51, 61, 71) will preferably have a thickness calculated as a Gaussian bell-shape for the electrode to electrode distance (on the basis of the above-mentioned "central" arrangement). Then, said tailored layer itself will be deduced from a truncation of the bell-shape, what is left, namely the pedestal of the bell-shape after truncation is the space for the plasma gap (internal process space 13), and the substrate.

Figure 9:
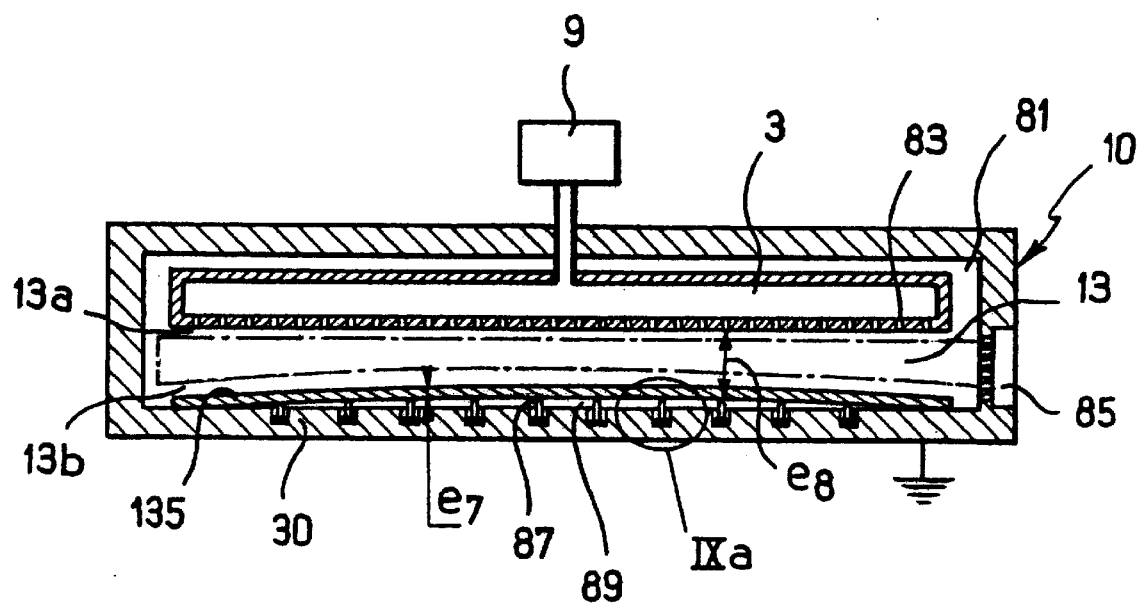

FIGS. 9 to 15 show other embodiments of an improved capacitively coupled radiofrequency plasma reactor, according to the invention. FIG. 9 shows the most straightforward implementation of the invention. The radiofrequency power source 9 is centrally connected to an upper electrode 3 called "shower head electrode" having holes 83 through its lower surface facing the plasma process space 13, within the inner chamber 81 of the reactor 10. The counter-electrode 30 is defined by the metallic external wall of the chamber 81. The admission of the reactive gas is not illustrated. But the pumping of said reactive gas is made through the exhaust duct 85.

It will be noted that all the mechanical (material) elements arranged within the reactor 10 and illustrated in FIG. 9 are kept flat (electrodes and substrate 135, notably). However, the substrate 135 (which has a uniform thickness $e_7$) is curved by laying it on series of spacing elements 87 erected between the substrate and the counter-electrode 30. The spacing supports 87 have variable height. The substrate 135 is curved due to its own flexibility. The average distance between the supports is defined by the substrate thickness and its Young modulus.

In this arrangement, there are two layers in the space between the electrodes that are not constant (uniform) in thickness: the plasma process space 13 itself and the "corrective space" 89 behind the substrate. Although this example is not a straightforward solution, this configuration is effective, because the RF power locally generated in the plasma depends far more on the little variation of the thin "gaseous" capacitive layer behind the substrate, than the small relative variation of the thickness $e_8$ of the plasma process space 13 (along the direction of elongation of electrode 3). The "corrective" tailored layer 89 is, in that case, behind the substrate. It is a gaseous (or partial vacuum) tailored layer, such a wording "vacuum" or "gaseous" being just used to stress the fact that this layer has a dielectric constant of 1. The layer can contain gases (the dielectric constant is not affected).

There is a danger that the supports 87, whether they are metallic or dielectric, introduce a local perturbation of the process.

Indeed, just at the support level where the series capacitor of the tailored "corrective" layer 89 is not present, the RF field is locally going to be larger. The perturbation, as seen by the plasma, is going to spread over a given distance around the support. This distance scales as the substrate thickness $e_7$ plus the "plasma sheath thicknesses" (typically 2–4 mm) referenced as 13a and 13b in FIG. 9.

Figure 9A:
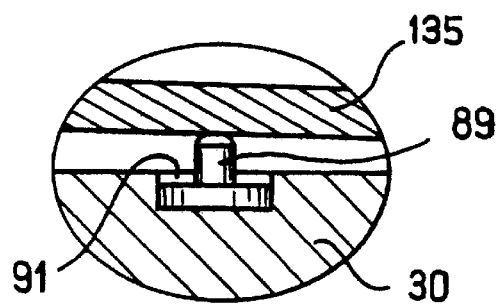

FIG. 9a shows a potential way to reduce to a bearable level the perturbation due to a support. The solution consists in surrounding each spacing member 89 by a small recess 91. At the recess level, the capacitive coupling is reduced. By adjusting the recess to make an exact compensation, the local perturbation should be practically eliminated.

In relation to the invention, such an arrangement shows that the tailored "corrective" layer proposed in the invention should follow the tailored profile, on the average: very local perturbations on the profile could be accepted as long as the capacitive coupling, remains substantially continuous and properly tailored, when averaged over a scale of a few millimeters.

Figure 10:
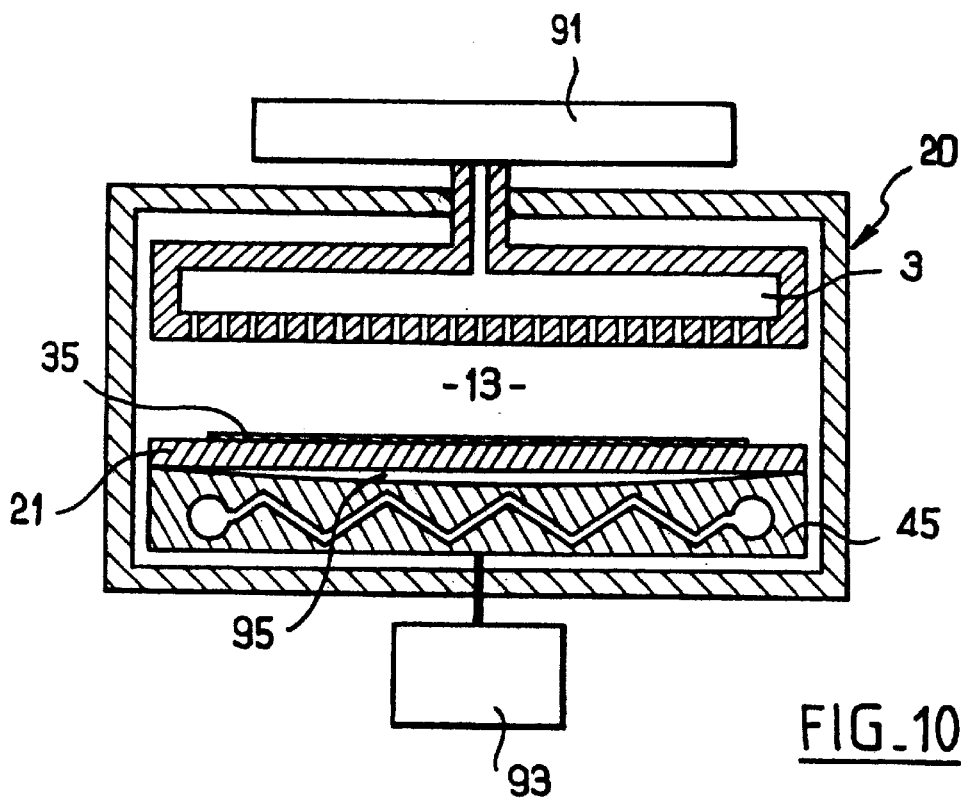

In the arrangement of FIG. 9, the substrate 135 is a dielectric member. This is important, since any tailored dielectric layer (such as 89) must absolutely be within the space defined by the two extremely opposed metallic layers defining the "process gap". If a substrate is metallic (electrically conductive), it screens off the effect of any underlying tailored capacity. Then, the substrate must be considered as one of the electrode. In FIG. 10 is illustrated a rather common design in the process industry. The reactor 20 is fed with two different driving energy sources : a RF high frequency source (higher than 30 MHz) and a RF bias source 93 (lower than 15 MHz). The upper "shower head" electrode 3 is connected to the high frequency source 91 and the low electrode 45 is connected to the RF bias source 93. One of the sources is meant to provide the plasma (in that case, we assume that it is an RF driving frequency with a rather high frequency, through source 91). The other source 93 is presently used as an additive to provide an extra ion bombardment on the substrate 35. Typically, such an extra input (93) is plugged on the "susceptor" side and is driven at 13.56 MHz. Such a RF bias feature is often used in etching systems to provide the reactive ion etching mode. It has been used in combination with many types of plasma (such as microwave, or electron cyclotron resonance). In the example of FIG. 10, there are two electrodes (3, 45) facing each other. None of them is actually grounded. However, even in that particular configuration, the tailored capacitor of the invention (layer 95 of a non uniform thickness) is appropriate. In the case of FIG. 10, the configuration of FIG. 5 is implemented. An important feature is that the active part of the reactor 20 (plasma process space 13, substrate 35, flat planar dielectric plate 21 of a uniform thickness and tailored gaseous gap 95 of a non uniform thickness) is between two metallic plates (electrodes 3, 45). The fact that one is grounded or not and the fact that one or several RF frequencies are fed on one and/or the other electrode, are irrelevant. The most important fact is that there is an RF voltage difference propagating between the two metallic plates 3, 45. In the example of FIG. 10, two RF frequencies are used. The drawing shows two injections (up and down) for the two RF waves. It is arbitrary. They could be injected from the top together, or from the bottom (upper electrode 3 or lower electrode 45). What is important here is that there are two different frequencies, one high frequency and one low frequency. Both propagate in the capacitive reactor.

If, as proposed, a tailored capacitor such as 95 is introduced to compensate for the high frequency non uniformity, it will make the "low frequency" non uniform. The "low" frequency wave amplitude will then provide a slightly hollow electric power profile due to the extra tailored capacitor in the center. In other words, applying the "tailoring" concept of the invention here makes sense only if the "high" frequency local power uniformity is more important for the process than the "low" frequency power uniformity.

Figure 11:
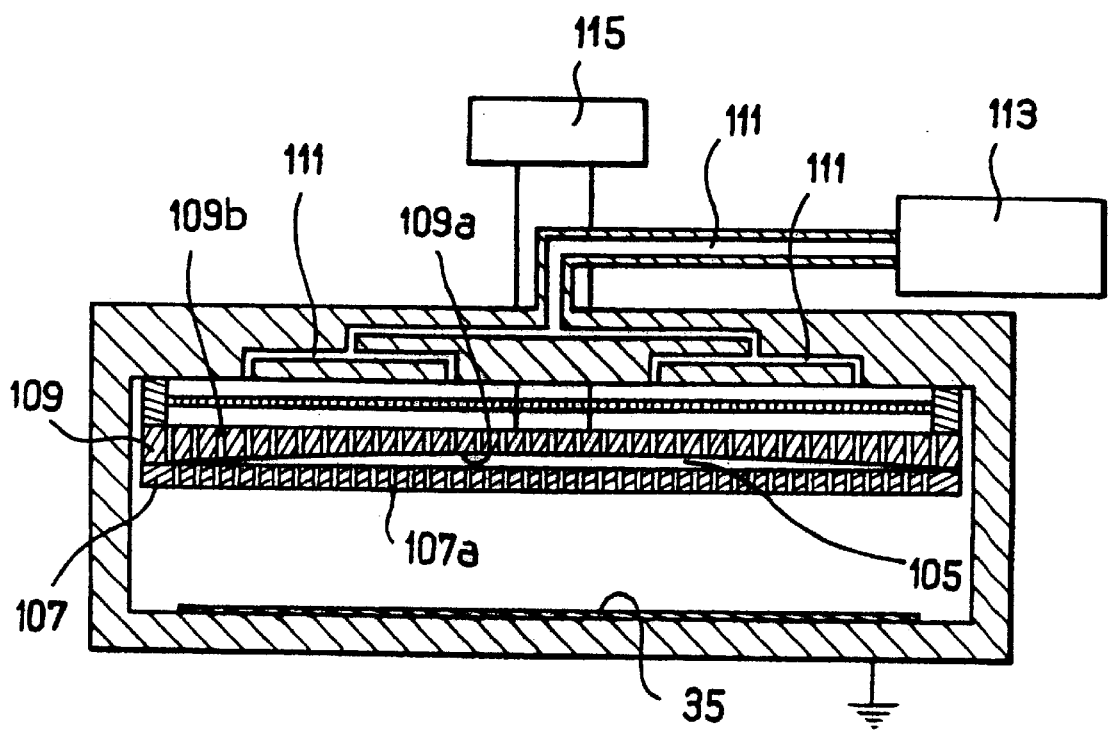

In FIG. 11, the tailored capacitive layer 105 is a gaseous space between a ceramic liner 105 and the metallic electrode 109 which has been machined to have the smooth and tailored recess (because of its non planar internal surface 109a) facing the back part of the ceramic plate 107. The ceramic liner 107 has many small holes 107a which transmit the reactive gas provided by the holes 109b in the backing metal electrode 109. The reactive gas is injected through ducts 111 connected to an external gas source 113 (the pumping means are not illustrated). The RF source 115 is connected to the electrode 109, as illustrated.

The design of the backing electrode 109 could have been a traditional "shower head" as electrode 3 in FIG. 10. Another option is the cascaded gas manifold design which is shown in FIG. 11.

In FIG. 12, a microwave capacitive plasma reactor 40 is diagrammatically illustrated. The illustration shows a possible design according to which a rather thick tailored layer generally referenced as 120 (the thickness of which is designated as $e_9$) is used to compensate for the drastic non uniformity due to electromagnetic propagation. The illustrated reactor 40 is a reactor for etching a rather small wafer.

The microwave comes from a coaxial wave guide 121 which expands gradually at 122 ("trumpet" shaped) to avoid reflection. Then, the microwave reaches the process zone 13 where the wave should converge to the center of the reactor (which is cylindrical).

For the dimensions, the substrate 35 arranged on a flat counter-electrode 126 has a diameter of about 10 cm, and an 1 GHz wave is generated by the microwave generator 123 (30 cm free space wave length). The central thickness of the tailored layer 120 (if made of quartz) should be about the same as the space 13 of the free plasma itself.

It is presently proposed that the tailored layer 120 be obtained from three dielectric plates defining three steps (discs 120*a*, 120*b*, 120*c*). The discontinuity of the steps should be averaged out by the plasma. The tailored layer is preferably very thick and it would actually make sense to call it "a lens".The number of disks used to constitute the lens could be four or higher if the ideally smooth shape of the lens must be reproduced with a better approximation.

In said FIG. 12, it will be noted that the reactive gas is introduced through the gas inlet 124, said reactive gas being pumped via a series of slits (preferably radially oriented) through the counter-electrode 126 and ending into a circular groove 125. The exhaust means for evacuating the reactive gas injected in the reactive space between the electrodes are not illustrated.

In FIG. 13, the reactor 50 corresponds to the reactor 40 of FIG. 12, except that, in this case, the step variation of the "corrective" dielectric layer 130 is not due to a change of thickness, but to a change of material constituting said layer 130 which has a uniform thickness along its surface. In other words, layer 130 is a variable dielectric constant layer having a uniform thickness $e_{10}$. The low dielectric constant layer is the central plate 131 which is concentrically surrounded by a second plate 132 having a medium dielectric constant layer. The third external concentric plate 133 has the highest dielectric constant.

Hence, the equivalent thickest part of the tailored layer 130 is made of the lowest dielectric material (quartz for example), whereas the intermediate layer 132 can be made of a material such as silicon nitride, the highest dielectric constant material at the periphery 133 being presently made of aluminum oxide.

The example of FIG. 13 clearly shows that the dielectric layer of the invention having a capacitance per unit surface values which are not uniform along a general surface generally parallel to the substrate can be obtained through a variation of the dielectric constant of said layer, while the thickness thereof remains uniform along its surface.

Figure 14:
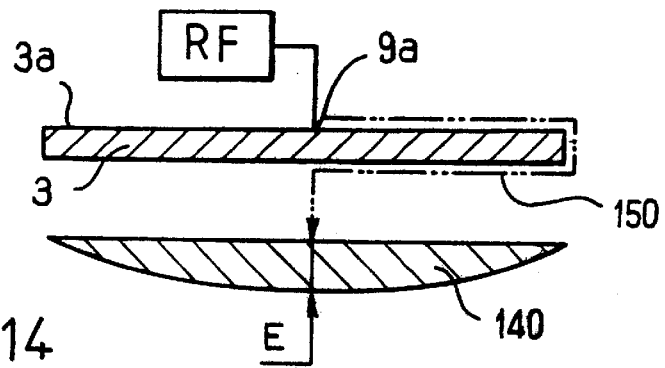
FIG. 14 illustrates the "tailoring" concept applied to a variation of thickness.

From the above description and the illustration of FIG. 14 (based on the embodiment of FIG. 1), it must be clear that, in any case in which the thickness of the "corrective layer", such as 140, is used to compensate the process non-uniformity, as observed, the corrective layer(s) will be the thickest in front of the location in the process space (or on the facing electrode, such as 3) which is the farest away from the electrode connection (9*a*). It is to be noted that the "way" (referenced as 150) for calculating said "distance" must follow the external surface (such as 3*a*) of the corresponding electrode.

Said thickness will be the lowest at the corresponding location where the above "distance" is the smallest, and the non planar profile of the layer will follow said distance decreasing.

What is claimed is:

1. A process for treating at least one substrate in a radiofrequency plasma reactor, comprising the steps of:
    locating the at least one substrate between two electrodes in the reactor, the two electrodes defining an internal process space there between;
    circulating a reactive gas within the reactor so that the reactive gas is present in the internal process space;
    connecting at least one radiofrequency generator to at least one of the electrodes at a connection location;
    operating the radiofrequency generator to create a plasma discharge in at least one zone of the internal process space to expose the substrate to a processing action of the plasma discharge;
    providing capacitor means having an electrical capacitance acting in series with the substrate and the plasma discharge, the capacitor means having a profile along the at least one substrate between the electrodes; and
    defining the profile so that a capacitance of the capacitor means varies along the at least one substrate in a location-dependant manner along the substrate for generating a selected RF voltage distribution in the plasma discharge along the substrate.

2. A process according to claim 1, including operating the radiofrequency generator at a frequency higher than 1 MHz, the at least one substrate having a surface larger than 0.5 m$^2$, and the largest dimension of the substrate surface exposed to the plasma discharge being greater than 0.7 m.

3. A process according to claim 1 wherein the step of defining the profile of the capacitor means comprises providing at least one dielectric layer having a non-uniform thickness between the two electrodes and along the substrate, the dielectric layer having a non-planar surface.

* * * * *

UNITED STATES PATENT AND TRADEMARK OFFICE
CERTIFICATE OF CORRECTION

PATENT NO. : 6,228,438 B1                                          Page 1 of 1
DATED      : May 8, 2001
INVENTOR(S) : Jacques Schmitt It is certified that error appears in the above-identified patent and that said Letters Patent is hereby corrected as shown below:

<u>Title page,</u>
Item [73], should read:
-- [73]  Assignee: Unaxis Balzers Aktiengesellschaft --

Signed and Sealed this

Nineteenth Day of November, 2002

Attest:

Attesting Officer

JAMES E. ROGAN
*Director of the United States Patent and Trademark Office*